(12) United States Patent
Brooks et al.

(10) Patent No.: US 8,023,661 B2
(45) Date of Patent: Sep. 20, 2011

(54) SELF-ADJUSTING AND SELF-MODIFYING ADDRESSABLE SPEAKER

(75) Inventors: Jeffrey R. Brooks, Ashburnham, MA (US); Bernard E. H. Laluvein, Middlesex (GB)

(73) Assignee: SimplexGrinnell LP, Westminster, MA (US)

( * ) Notice: Subject to any disclaimer, the term of this patent is extended or adjusted under 35 U.S.C. 154(b) by 874 days.

(21) Appl. No.: 12/040,300

(22) Filed: Feb. 29, 2008

(65) Prior Publication Data

US 2008/0219458 A1 Sep. 11, 2008

Related U.S. Application Data

(60) Provisional application No. 60/904,970, filed on Mar. 5, 2007.

(51) Int. Cl.
*H04R 29/00* (2006.01)
*G05B 23/02* (2006.01)

(52) U.S. Cl. ........ 381/56; 381/57; 381/58; 381/82; 381/104; 340/3.1; 340/506; 340/538

(58) Field of Classification Search .............. None
See application file for complete search history.

(56) References Cited

U.S. PATENT DOCUMENTS

| 6,426,697 B1 | 7/2002 | Capowski et al. |
| 6,792,404 B2 | 9/2004 | Jacob |
| 7,170,396 B2 | 1/2007 | Kalafarski |
| 7,508,303 B2 | 3/2009 | Capowski et al. |

*Primary Examiner* — Minh-Loan T Tran
(74) *Attorney, Agent, or Firm* — Brinks Hofer Gilson & Lione

(57) ABSTRACT

A self-adjusting speaker integrated with an alarm system is provided. The self-adjusting speaker may be used to aurally monitor an area (such as monitoring the ambient noise in the vicinity of the speaker) and adjust the speaker accordingly. The circumstances under which to aurally monitor a premises (such as how to monitor, when to monitor, what type of monitoring, etc.) may be varied. For example, there are several ways how to perform the aural monitoring (such as how to sense the ambient noise), including using a separate microphone or the speaker itself. A self-monitoring speaker integrated with an alarm system is also provided. The self-monitoring speaker may monitor the aural output of the speaker using a microphone or similar type of transducer. The aural output monitored by the microphone may be analyzed, and, based on the analysis, the data and/or operation of the speaker may be modified.

20 Claims, 5 Drawing Sheets

SELF-ADJUSTING AND SELF-MODIFYING ADDRESSABLE SPEAKER

REFERENCE TO RELATED APPLICATION

This application claims the benefit of U.S. Provisional Application No. 60/904,970, filed Mar. 5, 2007, the entirety of which is hereby incorporated by reference.

BACKGROUND

Alarm systems typically include a central control panel and one or more speakers located in various rooms of a building. The central control panel communicates with the speakers to generate an auditory output. The auditory output may include a vocal command (such as directions to the nearest exit in the event of a fire) and/or may include a beep, siren, whoop, or other sound. The auditory output may be heard by the occupants in the building in order for the occupants to take the appropriate action (such as exiting the building).

The speakers in the alarm system should be configured so that the occupants in the building can hear the auditory output. For example, there are regulations that dictate the loudness of the auditory output above the ambient noise where the speaker is located (e.g., 15 dB above the ambient noise). In order to configure the loudness of the auditory output, an operator typically travels to the location of the speaker, measures the ambient noise where the speaker is located, and adjusts the speaker's loudness accordingly. However, a need exists to more effectively and/or efficiently adjust the speakers for the ambient noise.

SUMMARY OF THE INVENTION

A self-adjusting speaker integrated with an alarm system is provided. The self-adjusting speaker may be used to aurally monitor an area (such as monitoring the ambient noise in the vicinity of the speaker) and adjust the speaker accordingly. The circumstances under which to aurally monitor a premises (such as how to monitor, when to monitor, what type of monitoring, etc.) may be varied. For example, there are several ways how to perform the aural monitoring (such as how to sense the ambient noise). Specifically, the ambient noise may be sensed by a microphone that is separate from the speaker. Or, the ambient noise may be sensed by the speaker itself. As another example, there are several ways when to perform the aural monitoring. Specifically, the ambient noise may be sensed periodically (such as every minute) or may be sensed based on a specific event (such as before or during an alarm event). There are also several types of aural monitoring. Specifically, a continuous spectrum (such as the audible frequency spectrum) or specific frequencies may be monitored.

As another example, there are several ways to analyze the data generated from the aural monitoring (such as which devices to perform the analysis, the criteria for the analysis, etc.). Specifically, a central controller of the alarm system may receive each aural monitoring reading, and may perform all of the analysis. Or, both the speaker and the central controller may perform the analysis (e.g., the speaker may calculate a short term average of the ambient noise and the central controller may calculate a long term average). Further, the data from the aural monitoring may be analyzed in several ways, including, for example, to determine the audibility and/or intelligibility of the speaker. Audibility may focus on overall output of the speaker (such as loudness of the speaker) and intelligibility may focus on specific frequencies or frequency ranges.

As still another example, there are several ways to adjust the operation of the speaker (such as adjust criteria of the speaker or adjust the data sent to the speaker) based on the analysis of the data generated from the aural monitoring. Specifically, the operation of at least one aspect of the speaker (such as the tap setting or the position of the speaker) may be modified based on the analysis. Or, the data sent to the speaker (such as changing the frequency or frequencies of the data for output on the speaker) may be modified based on the analysis.

A self-monitoring speaker integrated with an alarm system is also provided. The self-monitoring speaker may monitor the aural output of the speaker using a microphone or similar type of transducer. For example, the speaker may output a test tone for sensing by the microphone. The aural output monitored by the microphone may be analyzed, and, based on the analysis, the data and/or operation of the speaker may be modified.

The circumstances under which to monitor the aural output (such as when to monitor, etc.) may be varied. Further, there are several ways to analyze the data from the aural output being monitoring (such as which devices to perform the analysis, the criteria for the analysis, etc.). And, there are several ways to adjust the operation of the speaker (such as adjust criteria of the speaker or adjust the data sent to the speaker) based on the analysis of the data from the aural monitoring.

The self-monitoring speaker and the self-adjusting speaker described above may each be part of the same device, and may work in combination. For example, the self-adjusting portion of the speaker may perform an adjustment based on the ambient noise, and the self-monitoring portion of the speaker may perform an analysis of the aural output to determine whether the desired effect has been achieved. This analysis of both the self-adjusting portion and the self-monitoring portion may be performed once, or may be performed iteratively.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention. Moreover, in the figures, like referenced numerals designate corresponding parts throughout the different views.

DETAILED DESCRIPTION OF THE INVENTION

Alarm systems typically include one or more notification devices. As discussed in more detail below, the notification devices may include a speaker or a speaker in combination with a visual notification device (such as a video monitor or a strobe). The term "speaker" may include speaker(s), horns and/or any other devices capable of producing audible notification. The alarm systems, including the speakers, may be installed in a variety of environments whose noise properties change over time. For example, the structure of the environment may change over time, such as due to renovation, which may in turn change the noise properties of the environment. As another example, the use of the environment may change over time thereby changing its noise properties. Specifically, the use of the environment may change over the course of a day (such as in a lunch room in a school) or the use of the environment may change permanently (such as changing a room from a library to a nurses station). For example, a large conference room that during the day is used for a presentation, may later in the evening be used to host a cocktail reception. These changes to the use of the environment may affect the ability of people to hear aural notifications from the speaker(s) in the alarm system. In order to increase the ability of the people to hear the aural notifications, a speaker that is self-adjusting (e.g., adjusting for the quieter group in the day and then adjusting for the louder group in the evening) is provided, as discussed in more detail below.

Figure 1:
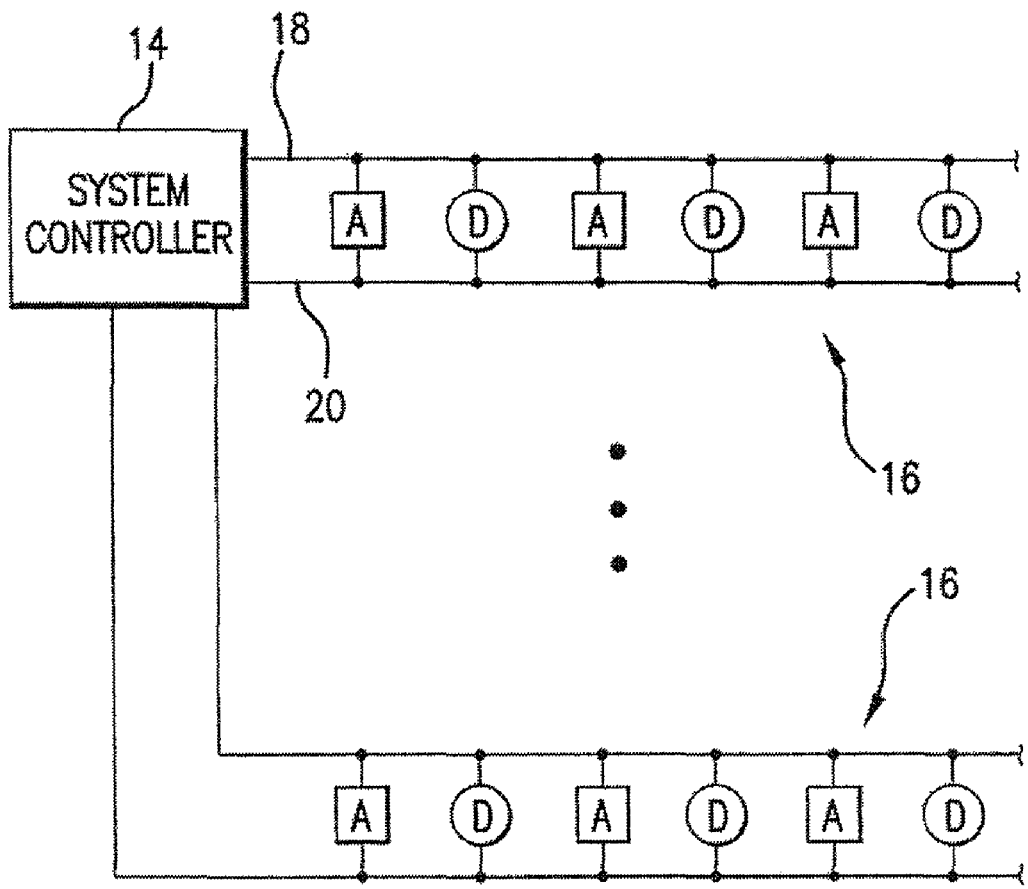
FIG. 1 is a block diagram illustrating an alarm system embodying an example of the present invention.

An example of the system embodying the present invention is illustrated in FIG. 1. The system may include one or more notification appliance circuits (NACs), i.e., networks 16, having alarm condition detectors D and alarm notification appliances A. Alternatively, the detectors and notification appliances may be on separate networks. The detectors D may be monitored by a system controller 14. When an alarm condition is sensed, the system controller 14 signals the alarm to the appropriate notification appliances through one or more networks 16. Notification appliances may include, for example, a visual alarm (strobe), a speaker, or other speaker-type devices (such as a horn), or a combination thereof.

Although not necessary for carrying out the invention, as shown, all of the notification appliances in a network are coupled across a pair of power lines 18 and 20 that advantageously also carry communications between the system controller 14 and the notification appliances A. The audio signal may be generally carried to appliances with speakers over a separate circuit (not shown).

Figure 2:
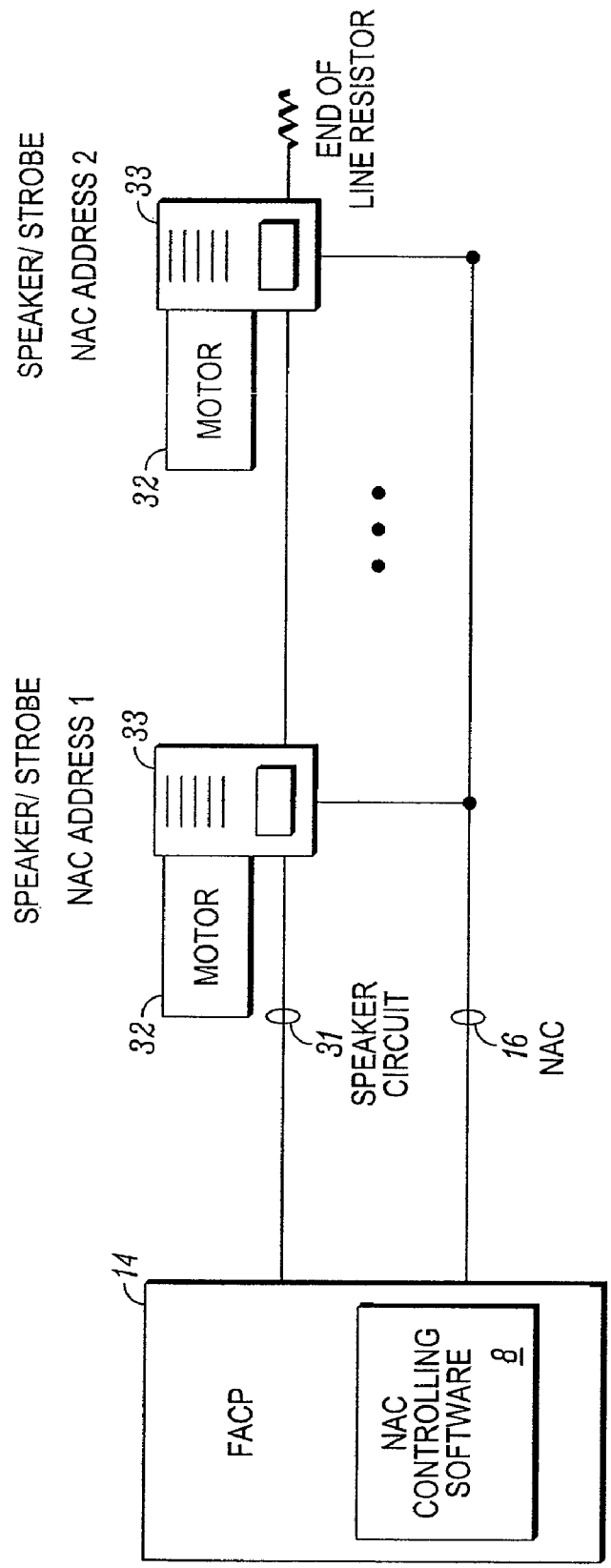
FIG. 2 is an example of a block diagram of the notification appliance circuit with two addressable speakers.

FIG. 2 is a schematic diagram showing a simplified notification appliance circuit 16 with two addressable speakers 33. Each speaker 33 has been assigned a unique address, in this example 1 and 2 respectively. The speakers 33 may communicate with a system controller 14, or fire alarm control panel (FACP), via a notification appliance circuit (NAC) 16. A separate speaker circuit 31 may provide an audio signal to the speakers 33. Further, the position of the speaker may be modified based on motor 32. The position may relate to any spatial position of the speaker and/or any orientation of the speaker (such as where the aural output of the speaker is aimed). For example the motor 32 may tilt the speaker up or down, or left or right. As discussed below, the direction of the speaker may modify the audibility or intelligibility of the speakers.

Figure 3:
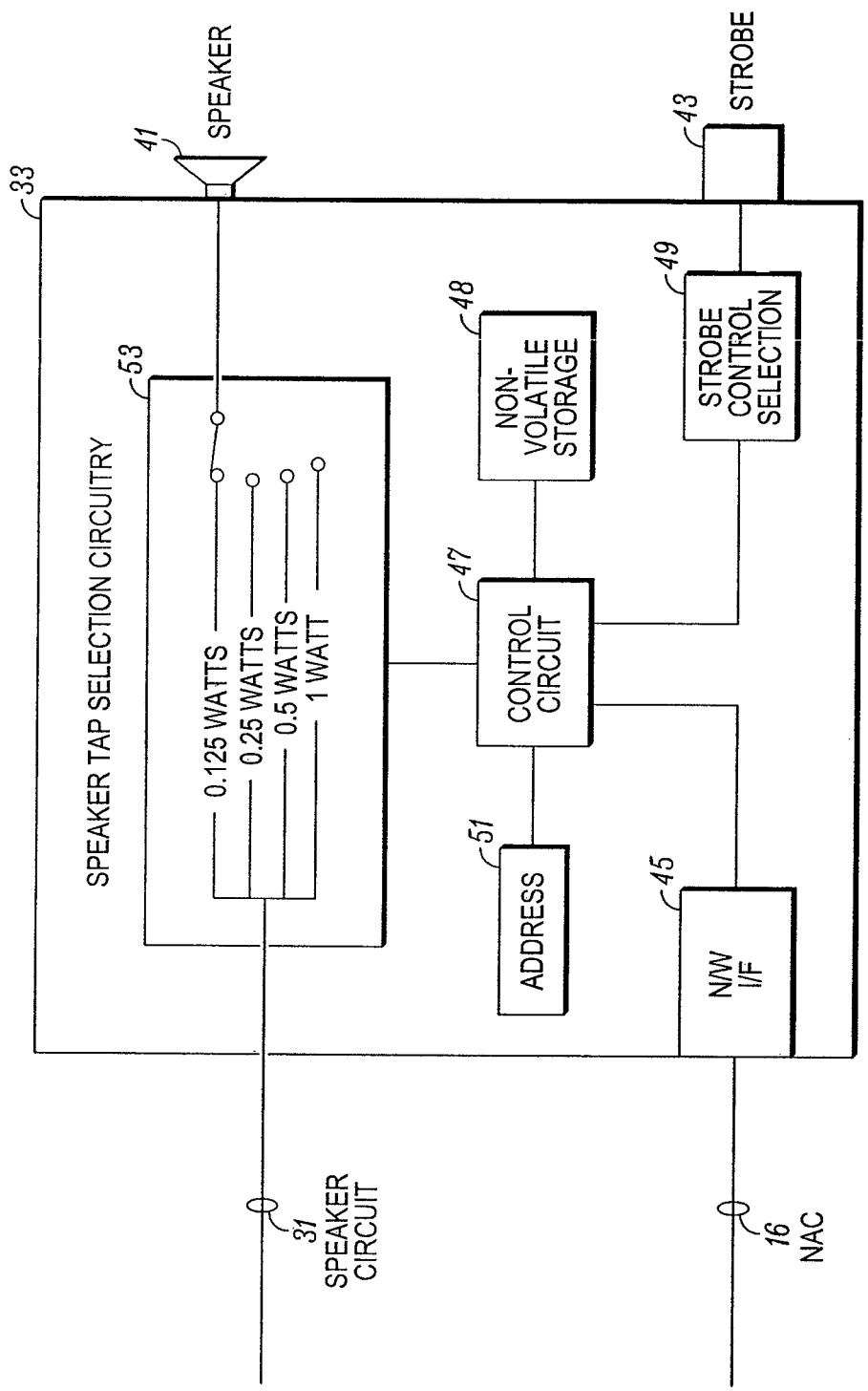
FIG. 3 is a schematic diagram of an addressable smart speaker of FIG. 2.

FIG. 3 is a schematic diagram of an addressable smart speaker 33 of FIG. 2. The addressable smart speaker 33 as shown includes an audio transducer 41, and optionally, a strobe 43. A network interface 45 connects to the notification appliance circuit 16. A control circuit 47, which may comprise, for example, a microprocessor or simple circuitry, determines from the speaker's address 51 whether a received message is intended for the device.

A strobe candela selection circuit 49 controls, in response to a properly addressed candela setting message, the strobe's candela setting, as discussed in U.S. Ser. No. 60/528,952, "Programmable Multi-Candela Notification Device," filed Dec. 11, 2003 and incorporated by reference herein in its entirety.

A speaker tap selection circuit 53, in response to a received command as interpreted by the control circuit 47, selects a tap to provide a selected power to the transducer 41. Many speakers used in fire alarm systems typically use 25 or 70-volt amplifiers (not shown). These speakers provide multiple sets of taps (not shown), one for each voltage. An addressable speaker according to an embodiment of the present invention allows the selection of any tap, for setting the desired power at the proper voltage.

Besides selecting the tap setting, other commands are available. The following commands are presented as examples and in no way are meant to limit the scope of the present invention. The specific circuitry to implement such features is not shown, but is well within the knowledge of one skilled in the art. For example, additional commands instruct the addressed speaker to activate or de-activate. These commands can be addressed to an individual speaker, a group of speakers, a virtual speaker circuit, or globally to all speakers. An activated speaker will broadcast the audio signal it receives from the speaker circuit 31 (FIG. 3), while an inactivated speaker will remain silent. Still another command is to modify the position of the speaker, such as by using motor 32. For example, the position of the speaker may be moved to the right, left, up, or down. These movements are provided for illustration only.

Figure 4:
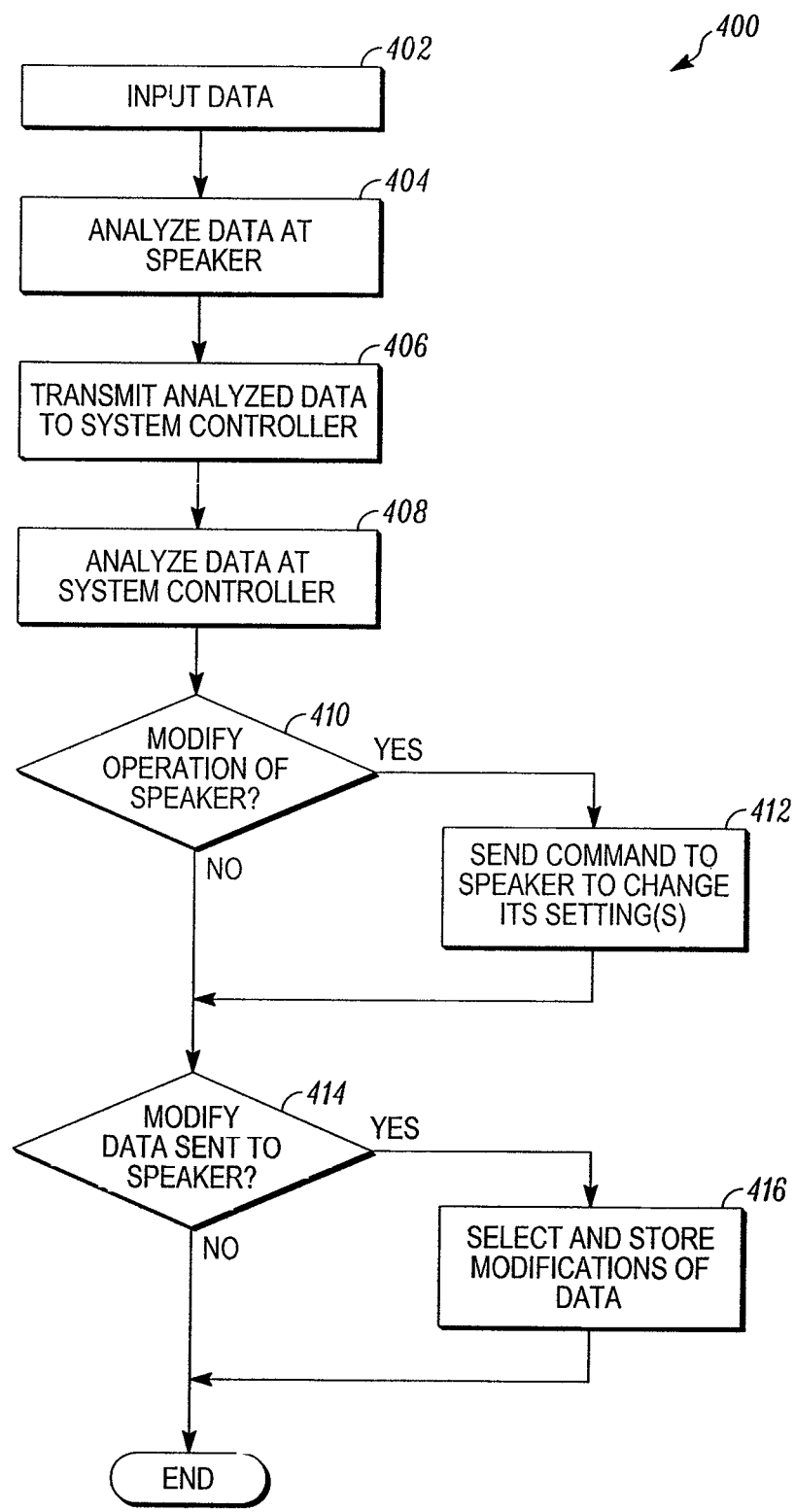
FIG. 4 is a flow chart of an example of adjusting of the speaker.

According to an embodiment of the present invention, an alarm system is provided in which one or more of the speakers in the alarm system may be adjusted. The adjustment of the one or more speakers may be based on the ambient noise proximate to the speaker(s). FIG. 4 shows one example of a flow chart 400 in which a speaker in the alarm system may be adjusted. As shown in block 402, data is input. The data may relate to ambient noise detected or sensed by one or more sensors. For example, the ambient noise may be detected using a microphone external to the speaker (such as a microphone positioned adjacent to the speaker or at a distance from the speaker), or using the speaker itself. Further, the ambient noise may be sensed periodically, such as at predetermined intervals, and/or may be sensed based on a specific event (such as before or during an alarm event). And, one or more frequencies (or one or more ranges of frequencies) may be sensed. For example, the one or more sensors may sense the amplitude at one or more frequencies (or one or more ranges) in the audible frequency range (roughly 20 Hz to 20 KHz), below the audible range, and/or above the audible range. Specifically, when analyzing for audibility, measurements may be taken at different frequencies within the audible range (such as at frequencies evenly spaced within a subset of the audible frequency range).

As another example, when analyzing for intelligibility, discussed in more detail below, a sensor that provides an indicator of intelligibility may be used. One example of the sensor is the Gold Line Model DSP30 device that provides Speech Transmission Index (STI) measurements. Still another example of a sensor that provides STI measurements is disclosed in U.S. Pat. No. 6,792,404 (incorporated by reference in its entirety). A proprietary test tone may be played through the system which the analyzer may then use to determine reduction in speech modulation. Other sensors may be used to provide different indicators of intelligibility, such as a sensor that measures the Common Intelligibility Scale (CIS) Score. The sensor that measures intelligibility may be positioned away from the speaker, such as in another part of the room where the speaker is housed. The sensor may be used concurrently with operation of the speaker, such as at the same time as the speaker outputs a predetermined sound.

As still another example, a sensor may be used to sense data indicative of reverberation of an environment. Reverberation may be based on various aspects (both dynamic and static) of the environment, including the placement of walls, the furniture, the wall coverings, the occupants, etc. Because the reverberation may change over time, the amount of reverberation in the environment may be measured periodically. One example of measuring reverberation is by emitting a signal from one or more frequencies (such as a discrete number of frequencies or a spectrum of frequencies) and by measuring, via the sensor, the levels of the frequencies emitted. In this manner, the amount of absorption or reflection of the emitted frequencies may be measured.

One or more reverberation measurements may be taken in an environment. For example, an environment may have one or more speakers. The reverberation measurements may be at one, some or all of the speakers. Specifically, multiple reverberation measurements may be taken for later analysis, as discussed below.

The data input from the sensor may be analyzed to determine whether to adjust the speaker (or the output sent to the speaker). For example, the data may be analyzed at the speaker (as shown at block 404), may be analyzed at the system controller 14 (as shown at block 408) after transmission (as shown at block 406), or may be analyzed at both the speaker and the system controller 14. The transmission of detected noise information (e.g., level) and adjustment command may be made over any communication path or combination of paths, including, but not limited to wired (including a fire alarm network), wireless, optical, etc.

The analysis may include a statistical analysis, such as calculating an average. For example a short term average may be calculated at the speaker (for example, inputting data every 20 seconds and calculating an average of the last 5 or 10 samples), and a long term average may be calculated at the system controller (for example, receiving the short term average from the speaker once every minute and calculating an average of the last 5 or 10 short term averages). The analysis may also focus on a certain portion or portions of the audible frequency spectrum, and/or may focus on specific frequencies. Further, the analysis may focus on a peak value in a portion(s) of the audible frequency spectrum or the peak value at one or more specific frequencies. For example, in analyzing audibility, the analysis may focus on the peak value of the frequencies that are measured in the audible frequency range.

There may be several methods to measure and quantify the transmission quality of speech with respect to intelligibility. These methods may be used for rating intelligibility and may take into account room acoustics, as well as the various components of the sound system. The intelligibility ratings derived by these methods may then be used to modify the operation of the speaker, as discussed below.

One method, discussed above, is STI. By way of background, speech may consist of the frequency of the sound being uttered and the amplitude modulation of that sound into the phonemes that create words. The STI method may measure the modulation transfer function for 14 modulation frequency bands spaced at ⅓-octave intervals from 0.63 Hz to 12.5 Hz, across seven frequency bands from 125 Hz to 8 KHz. These 98 measurement points (7×14) are weighted and combined to create a number between 0.0 (totally unintelligible) and 1.0 (perfectly intelligible). The standardization of the carriers and modulation frequencies to be used, as well as the weighting to be applied, has now been standardized by IEC 60268-16. A variation on the STI method is STIpa. STIpa is a special adaptation of the STI method for the measurement of speech intelligibility for public address (PA) systems. It is a modification to the STI method that has been correlated to within +/−0.03 CIS of a full STI measurement.

Another method, discussed above, is CIS. The CIS is not a method of measuring intelligibility itself, but is a standardized scale to which a variety of measurement methods are correlated. This allows a number of different measurement techniques to be used with a common baseline to which they can be compared. Each of the test methods described in the following sections has been correlated to the CIS, and can be used to determine a CIS rating.

In analyzing intelligibility, the analysis may focus on the values from the sensors that measure intelligibility, such as averaging the values from the sensors. As one example, the analysis may focus on the one or more reverberation measurements. In particular, the most reflected frequency (or frequencies) may be determined based on the reverberation measurements. Further, if multiple measurements are taken, each of the reverberation measurements may be analyzed to determine the most reflected frequency (or frequencies). Or, an average of the multiple measurements may be performed to determine the most reflected frequency (or frequencies) of the average. As another example, the analysis may focus on the sensors that measure intelligibility, such as the STI score or CIS Score. The STI score or CIS score may be compared to a predetermined value to determine whether the current configuration of the speakers is adequate. One example of a predetermined value may be 70, which some fire alarm codes have set as a minimum acceptable value for the Common Intelligibility Score. The predetermined value of 70 may be equivalent to an 80 percent word-comprehension rate and a 95 percent sentence-comprehension rate, which may be sufficient to transmit accurately an emergency message. Other predetermined values may be used. If the CIS score is greater than the predetermined value, the current configuration of the speakers may remain unchanged. If the CIS score is less than the predetermined value, the current configuration of the speakers may be changed, as discussed below, and the CIS score may be measured again after the change to determine if the CIS score score has improved or is greater than the predetermined value.

Other values, in addition to or instead of the average values, may be stored. For example, the current value of the background noise may be stored at the system controller 14 and/or at the speaker. And, the peak value for a predetermined period (such as the last 30 minutes) may be stored at the system controller 14 and/or at the speaker. Any one, some or all of these values may be used in determining whether to modify operation of the speaker or the data sent to the speaker, as discussed below.

Depending on the analysis, it is determined whether to modify operation of the speaker, as shown at block 410. As discussed above, the analysis may include a statistical analysis, such as a calculated average. Further, one or more calculated averages (such as from the speaker and the system controller) may be used. For example, if the operation of the speaker is modified to be at least 15 dB above the ambient noise, the calculated average (as calculated by the speaker, system controller, or both) of the ambient noise, such as the peak ambient noise, may be used. If the average ambient noise as calculated by the speaker and the system controller differ by less than a predetermined amount (such as 5 dB), one of (or a combination of) the speaker and the system controller averages may be used. If the average ambient noise as calculated by the speaker and the system controller differ by more than a predetermined amount (such as 5 dB), the speaker may be activated at the lower of the two averages and ramped upward to the higher of the two averages.

If it is determined to modify operation of the speaker, the system controller 14 may send a command to the speaker to modify its operation, as shown at block 412. Various aspects of the operation of the speaker may be modified, depending on whether audibility or intelligibility of the aural output is analyzed. For example, if audibility or intelligibility is at issue, the overall power output of the speaker may be modified. One way to modify the power output of the speaker may include selecting one of a plurality of taps that determine the audio power of the speaker. A speaker used in the alarm systems may use 25 or 70-volt amplifiers. The speaker may provide multiple sets of taps, one for each voltage, as shown in FIG. 3. In this manner, the speaker output wattage may be raised or lowered so that the speaker decibel (dB) level is some margin, e.g., 15 dB, above the ambient noise. Another way to modify operation of the speaker is by changing the position of the speaker. For example, the direction of the sound emitted from the speaker may be changed by moving the speaker using motor 32. Also, the operation of one speaker may be modified with respect to another speaker. For example, if the analysis indicates increased reverberance of an environment, the audio power of one speaker may be decreased relative to another speaker.

There may be advantages to having the system controller 14 at an alarm panel receive/process the information and control the speaker. For example, the setting of the speaker level via the alarm panel also allows for a manual override in the event of some catastrophic event. Second, multiple speakers in a room or area may be grouped and all set to the same output level. In addition, for testing and system commissioning the output level can be manually adjusted up or down (most likely down during periodic testing to minimize disruption in the facility).

Based on the analysis, it may also be determined whether to modify the data sent to the speaker, as shown at block 414. If so, the data is selected and the modifications are stored, as shown at block 416. For example, if the analysis indicates that the ambient noise is present in certain frequencies in the environment, an aural output with a different frequency (or frequencies) may be selected to distinguish over the ambient noise. Or, if the analysis indicates that the environment is reverberant at certain frequencies, different frequencies may be selected that are less reverberant. For example, if one spectrum of the audible frequency range is less intelligible (such as due to reverberance), a different spectrum of the audible frequency range may be selected to generate the audible output. As another example, certain frequencies may be determined to be reverberant in the environment. As discussed above, a spectrum (or discrete frequencies) may be emitted. A meter, or other sensor device, may be used to determine which frequencies are reflected. The frequencies that are reflected back to the meter (such as frequencies that reflect greater than a predetermined amount) may indicate reverberance of those frequencies within the specific environment. Similarly, the frequencies that measure less than a predetermined amount may be considered to be absorbed, and therefore less subject to reverberance. Based on the frequencies reflected, the frequency range (or ranges) for the audio warnings may be modified (such as changing the frequency range to one that has a lower reverberance). Or, the power of the audio warnings may be modified based on the frequencies reflected. For example, the wattage of the audio warning may be lowered based on the information regarding reverberance.

Further, the flow chart 400 may be performed iteratively. For example, an initial pass through the flow chart may determine a change to the operation of the speaker and/or the data sent to the speaker. Thereafter, a subsequent pass through the flow chart may measure whether the change to the operation of the speaker and/or the data sent to the speaker created the intended effect (such as an increase in intelligibility or audibility). For example, the CIS score of an environment may be measured. If the CIS score is less than a predetermined amount, the operation of and/or data sent to the speaker may be changed. The CIS score may be measured after the change. If the CIS score is greater than the predetermined amount, the speaker may thereafter be operated with the changed operation or data. If the CIS score is less than the CIS score measured prior to the change, a different change to the operation of or data sent to the speaker may be performed. If the CIS score is greater than the CIS score measured prior to the change, a similar change to the operation of or data sent to the speaker may be performed (such as a greater increase in wattage of the speaker).

In order to monitor operation of the speaker, a speaker that is self-monitoring is provided. The self-monitoring speaker may monitor the aural output of the speaker using a microphone or similar type of transducer. For example, the speaker may output a test tone for sensing by the microphone. The aural output monitored by the microphone may be analyzed, and, based on the analysis, the data and/or operation of the speaker may be modified.

Figure 5:
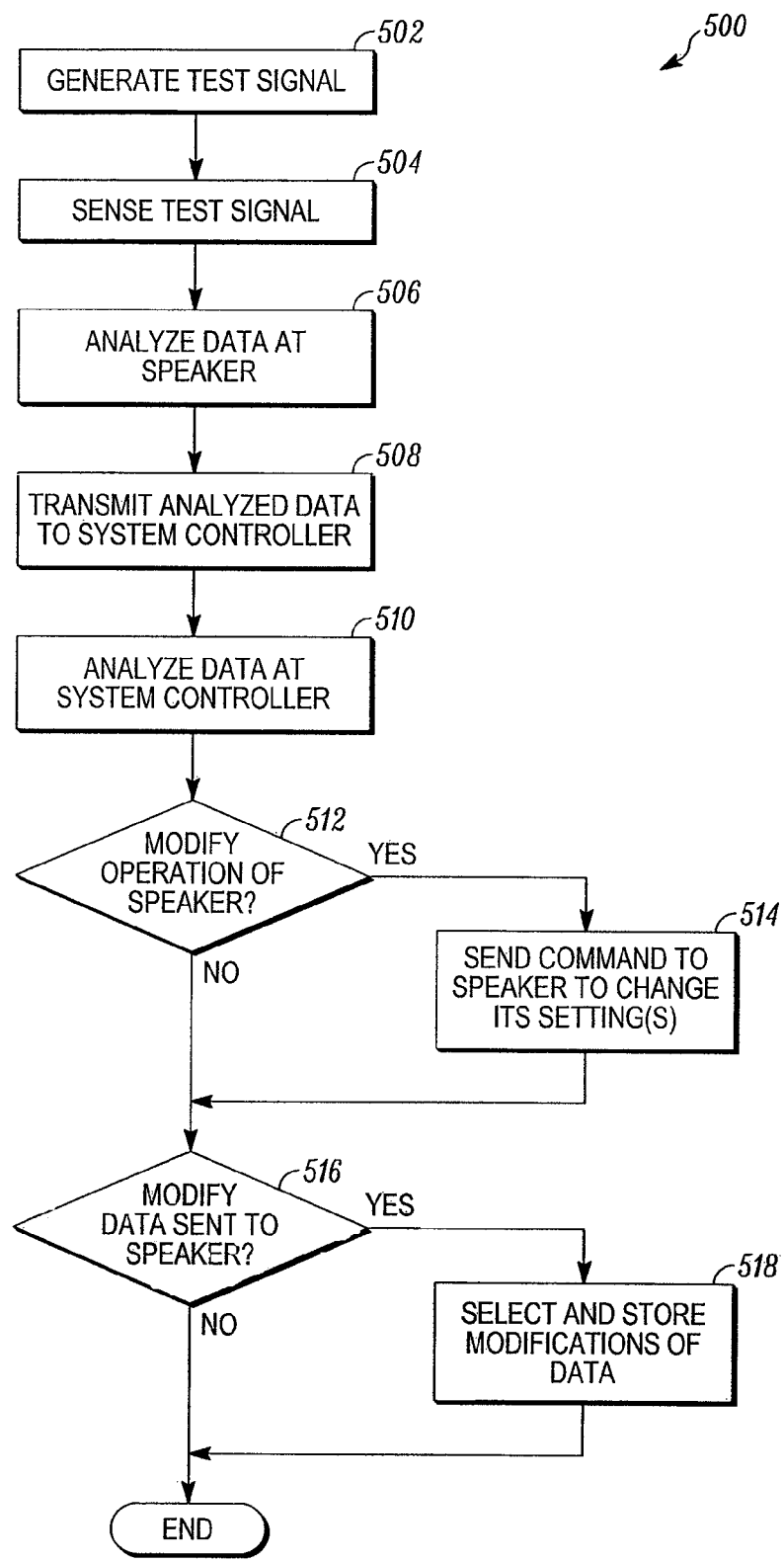
FIG. 5 is a flow chart of an example of monitoring of the speaker.

FIG. 5 shows one example of a flow chart 500 in which a speaker in the alarm system may be monitored. As shown in block 502, a test signal is generated. The test signal may comprise a signal at a specific frequency or a range of frequencies, in the audible range or outside the audible range (such as an inaudible signal). The test signal may be sensed, as shown at block 504. For example, the test signal may be sensed using a microphone, such as a microphone that is on the same circuit board as the transducer that generates the test signal. The sensed test signal may be analyzed at the speaker (as shown at block 506) and/or may be analyzed at the system controller (as shown at block 510) after transmission to the system controller (as shown at block 508). The transmission of sensed test signal and the adjustment command (discussed below) may be made over any communication path or combination of paths, including, but not limited to wired (including a fire alarm network), wireless, optical, etc.

Depending on the analysis, it is determined whether to modify operation of the speaker, as shown at block 512. Similar to the analysis described in FIG. 4, the analysis may include a statistical analysis, such as a calculated average. Further, one or more calculated averages (such as from the speaker and the system controller) may be used. For example a short term average may be calculated at the speaker (for example, inputting data every 20 seconds and calculating an average of the last 5 or 10 samples), and a long term average may be calculated at the system controller (for example, receiving the short term average from the speaker once every minute and calculating an average of the last 5 or 10 short term averages). The analysis may also focus on a certain portion or portions of the sensed test signal, such as a specific frequency or frequency range. Further, the analysis may focus on a peak value in a portion(s) of the range or the peak value at one or more specific frequencies.

If it is determined to modify operation of the speaker, the system controller 14 may send a command to the speaker to modify its operation, as shown at block 514. Various aspects of the operation of the speaker may be modified, depending on whether audibility or intelligibility of the aural output is analyzed. For example, if audibility is at issue, the overall power output of the speaker may be modified (such as by changing the selection of the tap).

Based on the analysis, it is determined whether to modify the data sent to the speaker, as shown at block 516. If so, the data is selected and the modifications are stored, as shown at block 518.

Alternatively, depending on the analysis, the operation of the system controller 14 or other speakers in the system may be modified. For example, the analysis may indicate that the speaker is not working properly or not working at all (such as the sensed test signal indicating a value lower than a predetermined amount). In this instance, the system controller 14 may send a signal to an operator indicating the error in one of the speakers. Alternatively, or in addition, the operation of other speakers in the system may be modified, such as increasing the wattage of speakers proximate to or in the same environment as the malfunctioning speaker.

The self-monitoring speaker and the self-adjusting speaker described above may each be part of the same device, and may work in combination. For example, the self-adjusting portion of the speaker may perform an adjustment based on the ambient noise, and the self-monitoring portion of the speaker may perform an analysis of the aural output to determine whether the desired effect has been achieved. This analysis of both the self-adjusting portion and the self-monitoring portion may be performed once, or may be performed iteratively.

While this invention has been particularly shown and described with references to preferred embodiments thereof, it will be understood by those skilled in the art that various changes in form and details may be made therein without departing from the scope of the invention encompassed by the appended claims.

The invention claimed is:

1. A notification appliance for use in an alarm system, the notification appliance comprising:
   a speaker;
   a network interface which connects to and receives messages over a network;
   microphone means for detecting ambient noise; and
   means for adjusting an output level of the speaker in response to the detected ambient noise.

2. The notification appliance of claim 1, wherein the microphone means comprises the speaker.

3. The notification appliance of claim 1, wherein the microphone means comprises a microphone separate from the speaker.

4. The notification appliance of claim 1, wherein the notification appliance transmits information regarding the detected ambient noise over the network.

5. The notification appliance of claim 1, wherein the notification appliance receives a command over the network, the means for adjusting an output level adjusting the output level of the speaker responsive to the command.

6. The notification appliance of claim 1,
   wherein a control panel which receives information regarding the detected ambient noise from the notification appliance, and which in response to the information transmits a command to the notification appliance to adjust the output level of the speaker.

7. The notification appliance of claim 1, wherein a control panel which receives information regarding the detected ambient noise from the notification appliance, and which in response to the information modifies an audio output for transmission to the notification appliance.

8. The notification appliance of claim 1, wherein the microphone means is activated during a test mode to verify operation of the speaker.

9. A notification appliance for use in an alarm system, the notification appliance comprising:
   a speaker;
   a network interface which connects to and receives messages over a network;
   sensor for generating data indicative of intelligibility; and
   means for reconfiguring the speaker or data to the speaker in response to the data indicative of intelligibility.

10. The notification appliance of claim 9, wherein the sensor comprises a device for generating a Speech Transmission Index (STI) measurement.

11. The notification appliance of claim 9, wherein the sensor comprises a device for sensing reflections of a test signal sent from the speaker.

12. The notification appliance of claim 9, wherein the means for reconfiguring the speaker adjusts an output level of the speaker.

13. The notification appliance of claim 9, wherein the means for reconfiguring the speaker moves the speaker.

14. An alarm system comprising:
   a notification appliance for use in the alarm system, the notification appliance comprising:
      a speaker;
      a network interface which connects to and receives messages over a network; and
      microphone means for detecting ambient noise, a control panel comprising
      a network interface which receives at least one message over the network, the message relating to the detected ambient noise;
      logic for analyzing the message relating to the detected ambient noise and for selecting, in response to the analyzing of the message, an audio output for the notification appliance,
   wherein the control panel transmits the selected audio output to the notification appliance via the network interface of the control panel, and
   wherein the speaker of the notification appliance outputs the selected audio output.

15. The alarm system of claim 14, wherein the logic for selecting an audio output comprises selecting an audio frequency range for the audio output.

16. In a notification appliance for use in an alarm system, the notification appliance comprising a speaker, a network interface which connects to and receives messages over a network, and means for adjusting an output level of the speaker or data to the speaker in response to the detected ambient noise, the method for adjusting the output level of the speaker comprising:
   detecting ambient noise;
   analyzing the ambient noise;
   receiving a command via the network interface to adjust the output level of the speaker based, at least in part, on the analyzed ambient noise; and
   configuring the notification appliance to adjust the output level of the speaker in response to the command.

17. The method of claim 16, further comprising transmitting, by the notification appliance to a control panel, information regarding the detected ambient noise over the network.

18. The method of claim 16, further comprising:
   receiving, by a control panel, information regarding the detected ambient noise from the notification appliance, and transmitting, in response to the information, the command to the notification appliance to adjust the output level of the speaker.

19. The method of claim 16, further comprising:
receiving, by a control panel, information regarding the detected ambient noise from the notification appliance, and selecting, in response to the information, an audio output for transmission to the notification appliance.

20. The method of claim 16, further comprising activating the microphone means during a test mode to verify operation of the speaker.

* * * * *